United States Patent
Shah et al.

(10) Patent No.: US 8,242,452 B1
(45) Date of Patent: Aug. 14, 2012

(54) CESIUM AND SODIUM-CONTAINING SCINTILLATOR COMPOSITIONS

(75) Inventors: Kanai S. Shah, Newton, MA (US); William M. Higgins, Westborough, MA (US); Edgar V. Van Loef, Allston, MA (US); Jaroslaw Glodo, Allston, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 676 days.

(21) Appl. No.: 12/405,155

(22) Filed: Mar. 16, 2009

Related U.S. Application Data

(63) Continuation-in-part of application No. 11/938,182, filed on Nov. 9, 2007.

(60) Provisional application No. 61/045,871, filed on Apr. 17, 2008.

(51) Int. Cl.
G01T 1/20 (2006.01)
G01T 1/24 (2006.01)

(52) U.S. Cl. ............... 250/361 R; 250/370.11

(58) Field of Classification Search ......... 250/361 R, 250/367, 370.11, 458.1, 363.03, 363.04
See application file for complete search history.

(56) References Cited

U.S. PATENT DOCUMENTS

| | | | |
|---|---|---|---|
| 5,367,176 | A | 11/1994 | Leblans et al. |
| 6,585,913 | B2 | 7/2003 | Lyons et al. |
| 2002/0175291 | A1 | 11/2002 | Reeder et al. |
| 2007/0131866 | A1 | 6/2007 | Srivastava et al. |
| 2007/0131874 | A1 | 6/2007 | Srivastava et al. |
| 2007/0187608 | A1 | 8/2007 | Beer et al. |
| 2008/0001086 | A1 | 1/2008 | Srivastava et al. |
| 2008/0131347 | A1 | 6/2008 | Srivastava et al. |

FOREIGN PATENT DOCUMENTS

WO   WO 2005/068585 A1   7/2005

OTHER PUBLICATIONS

Bessiere et al., "Luminescence and Scintillation Properties of the Small Band Gap Compound $LaI_3:Ce^{3+}$," *Nucl. Instr. Meth. Phys. Res. A* 537:22-26 (2005).

Birowosuto et al., "Scintillation Properties of $LuI3:Ce3+$-High Light Yield Scintillators," *IEEE Trans. Nucl. Sci.* 52:1114-1118 (2005).

Birowosutu et al. "Scintillation Properties and Anomalous $Ce^{3+}$ Emission of $Cs_2NaREBr_6:Ce^{3+}$ (RE = La, Y, Lu)," *J. Phys. Condens. Matter* 18:6133-6148 (2006).

Bollinger and Thomas, "Measurement of the Time Dependence of Scintillation Intensity by a Delayed-Coincidence Method," *Rev. Sci. Instr.* 32:1044-1050 (1961).

(Continued)

*Primary Examiner* — David Porta
*Assistant Examiner* — Faye Boosalis
(74) *Attorney, Agent, or Firm* — Wolf, Greenfield & Sacks, P.C.

(57) ABSTRACT

The present invention relates to scintillator compositions and related devices and methods. The scintillator may include, for example, a mixed halide scintillator composition including at least two different CsNaLa halide compounds and a dopant. Related radiation detection devices and methods are further included.

16 Claims, 5 Drawing Sheets

OTHER PUBLICATIONS

Combes et al., "Optical and Scintillation Properties of Pure and $Ce^{3+}$-doped $Cs_2LiYCl_6$ and $Li_3YCl_6:Ce^{3+}$ crystals," *J. Lumin.* 82:299-305 (1999).

Dorenbos et al., "Non-Proportionality in the Scintillation Response and the Energy Resolution Obtainable with Scintillation Crystals," *IEEE Trans. Nucl. Sci.* 42:2190-2202 (1995).

Guillot-Noel et al., "Scintillation Properties of $RbGd_2Br_7$:Ce Advantages and Limitations," *IEEE Trans. Nucl. Sci.* 46:1274-1284 (1999).

Oomen et al., "On the Luminescence of the $Sb^{3+}$ ion in $Cs_2NaMBr_6$ (M = Sc, Y, La)," *J. Phys. C: Solid State Phys.* 20:1161-1171 (1987).

Rodnyi et al., "Luminescence Properties of Ce-doped $Cs_2LiLaCl_6$ Crystals," *J. Lumin.* 86:161-166 (2000).

Rodnyi, "Progress in Fast Scintillators," *Rad. Measur.* 33:605-614 (2001).

Van Loef et al., "Scintillation and Spectroscopy of the Pure and $Ce^{3+}$-doped elpasolites: $Cs_2LiYX_6$ (X=Cl, Br)," *J. Phys.: Condens. Matter* 14:8481-8596 (2002).

CESIUM AND SODIUM-CONTAINING SCINTILLATOR COMPOSITIONS

CROSS REFERENCES TO RELATED APPLICATIONS

The present application claims the benefit of priority to U.S. application Ser. No. 11/938,182, entitled "Cesium and Sodium-Containing Scintillator Compositions," filed on Nov. 9, 2007 and U.S. Application No. 61/045,871, filed Apr. 17, 2008, the entire content of each of which is incorporated herein by reference.

The present application is related to U.S. application Ser. No. 11/938,182, entitled "Cesium and Lithium-Containing Quaternary Compound Scintillators," filed on Mar. 16, 2009 and U.S. application Ser. No. 12/405,168, entitled "Mixed Cesium Sodium and Lithium Halide Scintillator Compositions," filed on Mar. 16, 2009, each of which is being filed concurrently herewith, the full disclosures of which are incorporated herein by reference.

STATEMENT REGARDING FEDERALLY SPONSORED RESEARCH OR DEVELOPMENT

This invention was made with government support under grant number DE-FG02-06ER84640 awarded by the Department of Energy. The government may have certain rights to this invention.

BACKGROUND OF THE INVENTION

The present invention relates to scintillator compositions and related devices and methods. More specifically, the present invention relates to scintillator compositions including a scintillation compound and a dopant for use, for example, in radiation detection, including gamma-ray spectroscopy, and X-ray and neutron detection, imaging applications, and the like.

Scintillation spectrometers are widely used in detection and spectroscopy of energetic photons (e.g., X-rays, gamma-rays, etc.). Such detectors are commonly used, for example, in nuclear and particle physics research, medical imaging, diffraction, non destructive testing, nuclear treaty verification and safeguards, nuclear non-proliferation monitoring, and geological exploration.

Important requirements for the scintillation crystals used in these applications include high light output, transparency to the light it produces, high stopping efficiency, fast response, good proportionality, low cost, and availability in large volume. These requirements on the whole cannot be met by many of the commercially available scintillator compositions. While general classes of chemical compositions may be identified as potentially having some attractive scintillation characteristic(s), specific compositions/formulations having both scintillation characteristics and physical properties necessary for actual use in scintillation spectrometers and various practical applications have proven difficult to predict. Specific scintillation properties are not necessarily predictable from chemical composition alone, and preparing effective scintillator compositions from even candidate materials often proves difficult. For example, while the composition of sodium chloride had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials.

Since the invention of NaI(Tl) scintillators in the 1940's, for half a century radiation detection applications have depended to a significant extent on this material. The fields of nuclear medicine, radiation monitoring, and spectroscopy have grown up supported by NaI(Tl). Although far from ideal, NaI(Tl) was relatively easy to produce for a reasonable cost and in large volume. With the advent of X-ray CT in the 1970's, a major commercial field emerged as did a need for different scintillator compositions, as NaI(Tl) was not able to meet the requirements of CT imaging. Later, the commercialization of positron emission tomography (PET) imaging provided the impetus for the development of yet another class of detector materials with properties suitable for PET. As the methodology of scintillator development evolved, new materials have been added, and yet, specific applications are still hampered by the lack of scintillators suitable for particular applications.

As a result, there is continued interest in the search for new scintillator compositions and formulations with both the enhanced performance and the physical characteristics needed for use in various applications. Today, the development of new scintillator compositions continues to be as much an art as a science, since the composition of a given material does not necessarily determine its properties as a scintillator, which are strongly influenced by the history (e.g., fabrication process) of the material as it is formed. While it may be possible to reject a potential scintillator for a specific application based solely on composition, it is typically difficult to predict whether even a material with a promising composition can be used to produce a useful scintillator with the desired properties.

One of the uses of radiation monitoring devices is preventing the spread of weapons such as nuclear weapons. One way to passively determine the presence of nuclear weapons is to detect and identify the characteristic signatures of special nuclear materials (SNMs) such as highly enriched uranium and weapons grade plutonium. Characteristic X-rays and gamma-rays are signatures of these materials. The general approach to a passive gamma-ray assay is to acquire raw spectra, correct the spectra for rate-related electronic losses and source attenuation, and compute the total corrected count rate, which is proportional to the mass of the isotope being assayed. The proportionality constant includes the effects of gamma-ray emission rate, solid angle, and detector efficiency.

Monitoring for both highly enriched uranium and weapons grade plutonium involves analysis of X-ray and gamma-ray spectra with multiple energies of interest. One important consideration in SNM monitoring is the determination of uranium enrichment since highly enriched uranium can be used for development of nuclear weapons. The naturally occurring isotopic abundance of uranium is: $^{238}U$ (99.27%), $^{235}U$ (0.720%) and $^{234}U$ (0.006%). When the fraction of the fissile $^{235}U$ is higher than that in naturally occurring uranium, the uranium is said to be enriched. The relative intensity of 185.7 keV gamma-rays (from $^{235}U$) compared to the 94-98 keV X-rays for uranium in an unattenuated spectrum can be used to determine uranium enrichment (*Passive Nondestructive Assay of Nuclear Materials*, eds. Reilly et al., U.S. Nuclear Regulatory Commission, Washington D.C., pp. 11-18, (1991)). As the uranium enrichment level increases, the relative intensity of the 185.7 keV gamma-ray peak increases in comparison to the 94-98 keV X-ray peak. Another consideration in SNM monitoring is to distinguish "weapons-grade" plutonium (with >93% $^{239}Pu$) from "reactor-grade" plutonium<60% $^{239}Pu$). The "reactor-grade" plutonium includes other isotopes such as $^{240}Pu$, $^{241}Pu$, $^{242}Pu$, and $^{238}Pu$. Comparison of gamma-ray signatures of $^{239}$PU (such as 129.3 keV and 413.7 keV photons) with those for other plutonium isotopes allows determination of the grade of plutonium. In addition to the characteristic X- and gamma-rays of highly enriched uranium and weapons grade plutonium, there is considerable interest in the measurement of irradiated fuel from nuclear reactors because of the plutonium produced during reactor operation. Due to very intense gamma-rays emitted by fission products of the irradiated fuel, gamma-rays from spontaneous decay of plutonium and uranium ($^{235}$U, $^{239}$Pu and $^{241}$Pu) are generally not used for measurement of irradiated fuel. The most commonly measured fission product gamma-ray is the 662 keV line from $^{137}$Cs. Recent threat of "dirty bombs" (devices which spread radioactive material using conventional, non-nuclear explosives) has also created an interest in monitoring of radioactive materials such as $^{137}$Cs, $^{60}$Co, $^{241}$Am, Am radioactive medical waste, and irradiated fuel from nuclear reactors that emit high energy gamma-rays.

Thus, gamma-ray spectrometers and radiation detectors are important tools in monitoring of special nuclear materials. A number of homeland security systems such as hand-held radioisotope identifiers, vehicle portals for radiation detection, and personal radiation detection devices rely on availability of high performance gamma-ray spectrometers. Similar systems are also required for nuclear non-proliferation monitoring. An important challenge in homeland security monitoring is not only to detect hidden radioactive materials but also to distinguish them from routinely used radiopharmaceuticals as well as from naturally occurring benign radioactive materials.

Existing scintillator materials and commercial radiation detectors do not meet the current needs for radiation monitoring and weapons detection. For example, existing scintillator compositions and detectors typically lack the one or more important scintillation properties (e.g., high energy resolution, light output, stopping power, fast response, and the like) that are desired and/or are not useful in detecting both energetic photons (e.g., gamma-rays and X-rays) as well as neutron emission. Thus, a need exists for improved scintillator compositions suitable for use in various radiation detection applications, including, for example, radiation and nuclear weapons monitoring.

BRIEF SUMMARY OF THE INVENTION

The present invention provides scintillator compositions including mixed halide quaternary compounds including different CsNaLa halide compound and a dopant, as well as related devices and methods. Scintillator compositions of the invention can have in common a quaternary composition comprising Cs and Na, a Lanthanide and a Halide. Scintillator compositions can include one or more of the cesium and sodium-containing quaternary compounds disclosed herein, and in mixed halide composition embodiments, will include a mixture of any two or more of the quaternary compounds provided. Exemplary compounds can include halides selected from F, Cl, Br, or I.

Excellent scintillation properties, including high light output, good proportionality, fast response, and good energy resolution have been measured for exemplary compositions, which were demonstrated to be suitable for gamma-ray spectroscopy, as well as X-ray and neutron emission detection. Scintillator compositions described herein are cubic (and therefore easy to grow) have high light output and fast response. For gamma rays, the non-proportionality is particularly outstanding and can translate into good energy resolution. These materials have very good non-proportionality (e.g., about 2% non-proportionality over 60 to 1000 keV energy range). The scintillator compositions show outstanding light output for neutrons in comparison to previously existing neutron scintillators and can show pulse shape discrimination between neutrons and gamma rays. Thus, these materials additionally advantageously combine excellent gamma-ray detection properties along with neutron detection.

Scintillation properties of the crystals/compositions include peak emission wavelengths from about 385 to about 475 nm, which is well matched to PMTs as well as silicon diodes used in nuclear instrumentation and a peak wavelength for gamma-ray spectroscopy. The present invention includes scintillator compositions having decay time constants better than, or having a value of less than, 200 ns (e.g., less than 150 ns). In some embodiments, the decay time constant can be better than about 100 ns, or even better than about 50 ns. The principal decay-time constant in one instance was measured at approximately 50 ns, which is faster than the decay-time constant of commercial scintillators such as BGO and GSO (see, e.g., Table 1 infra). Under gamma ray excitation, the light output will be greater than about 10,000 photons/MeV, and in some embodiments, greater than about 20,000, 40,000, or 60,000 photons/MeV (e.g., ranging from about 17,000 to about 60,000 photons/MeV and greater), which is greater than that of many widely used commercial scintillators.

One aspect of the present invention includes a scintillator composition including a scintillation compound and a dopant. Scintillation compounds can include a compound with the formula $x_1$-$x_2$-$x_3$-$x_4$, where $x_1$ can include Cs, $x_2$ can include Na, $x_3$ can include La, Gd, or Lu, and $x_4$ can include a halide. In some embodiments, the scintillator composition can include a single dopant or a mixture of dopants. Scintillator compositions of the present invention can include a mixture of different compounds (e.g., quaternary compounds) disclosed herein, such as mixed halide compositions including two or more different CsNaLa halide compounds.

In another aspect, the invention further includes devices, such as a radiation detection device having a scintillator composition as described herein, and a photodetector assembly optically coupled to the scintillator composition. The photodetector assembly can include, for example, a photomultiplier tube, a photo diode, or a PIN detector. The device may further include a data analysis, or computer, system for processing and analyzing detected signals.

In yet another aspect, the invention includes an X-ray and neutron detector assembly, including a scintillator compositions described herein, a photodetector assembly, and electronics or a system for data processing/analysis. For example, the device can include electronics configured for performing pulse-shape analysis to differentiate gamma ray from neutron emissions.

In yet another aspect, the invention includes a method of performing radiation detection. Such a method can include, for example, providing a detection device having a detector assembly including a scintillator compositions described herein; a photodetector assembly; and positioning a target within a field of view of the scintillator as to detect emissions from the target. Emissions can include, for example, gamma-ray, X-ray, or neutron emissions. A target can include various potential sources of detectable emissions including neutron emitters (e.g., plutonium and the like), gamma-ray sources (e.g., uranium and the like), X-ray sources, etc. In one embodiment, for example, the scintillator compositions can be used for imaging applications including medical imaging such as in a method of performing PET (e.g., time-of-flight PET) or SPECT. In such an embodiment, the imaging method can comprise injecting or otherwise administering a patient with a detectable label, and, after a sufficient period of time to allow localization or distribution of the label, placing the patient within the field of view of the detection device. Thus, in some embodiments the target includes a patient or a portion of a patient's body.

For a fuller understanding of the nature and advantages of the present invention, reference should be had to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

BRIEF DESCRIPTION OF THE DRAWINGS

FIGS. 1A, 1C, and 1D further depict $^{137}$Cs spectra for BGO coupled to a PMT.

FIGS. 2A and 2D show optical emission spectra for 1% and 2% Ce with $Cs_2NaGdI_6$:Ce and $Cs_2NaLuI_6$:Ce, respectively.

DETAILED DESCRIPTION OF THE INVENTION

Figure 1:
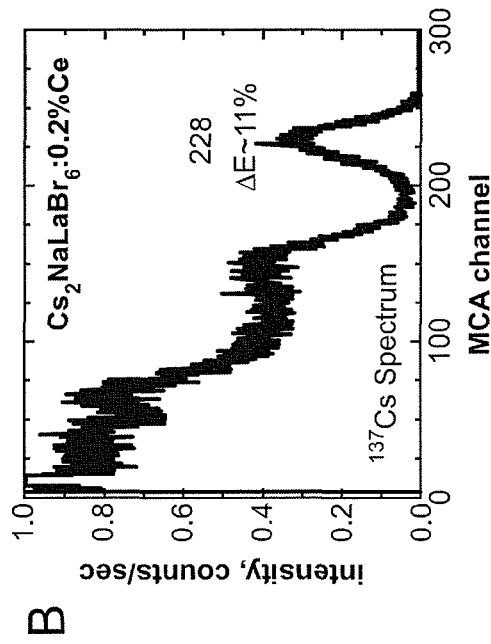
FIGS. 1A through 1D depict $^{137}$Cs spectra collected with $Cs_2NaGdI_6$:2% Ce (FIG. 1A), $Cs_2NaLaBr_6$:0.2% Ce (FIG. 1B), $Cs_2NaLaI_6$:5% Ce (FIG. 1C), and $Cs_2NaLuI_6$:1% Ce (FIG. 1D) scintillator compositions coupled to a PMT. The energy resolutions of a 662 keV peak for $Cs_2NaGdI_6$:2% Ce, $Cs_2NaLaBr_6$:0.2% Ce, $Cs_2NaLaI_6$:5% Ce, and $Cs_2NaLuI_6$:1% Ce are 7.6%, 11%, 5.25%, and 8.5% (FWHM), respectively.
Figure 1:
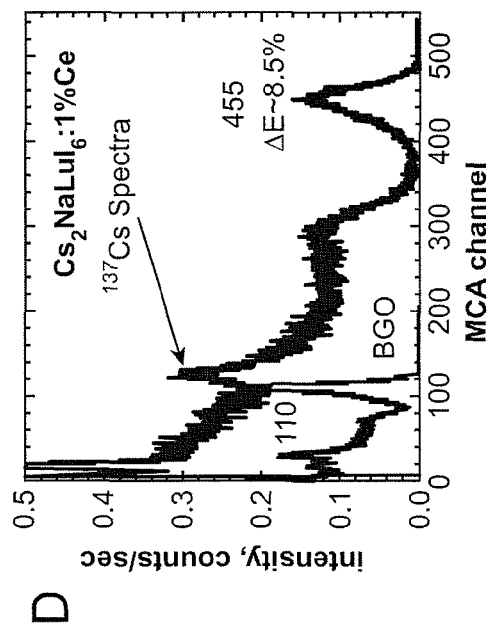
Figure 1:
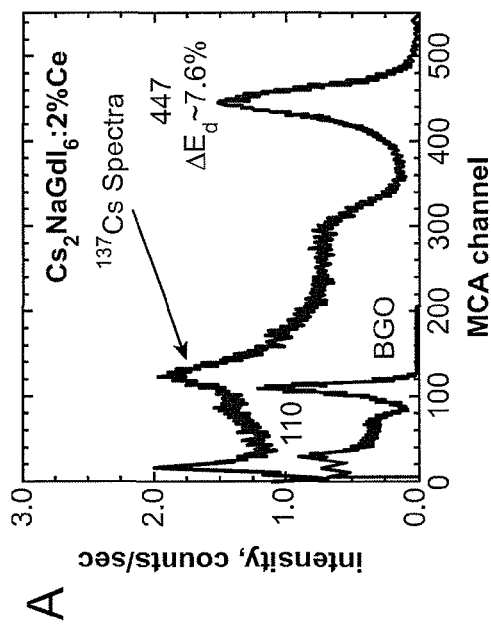
Figure 1:
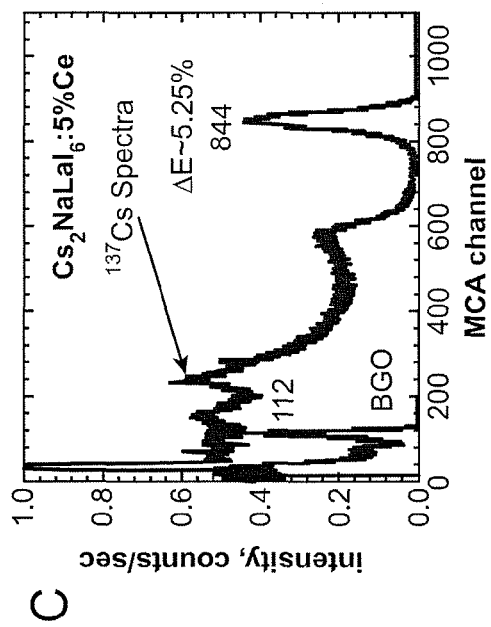
Figure 2:
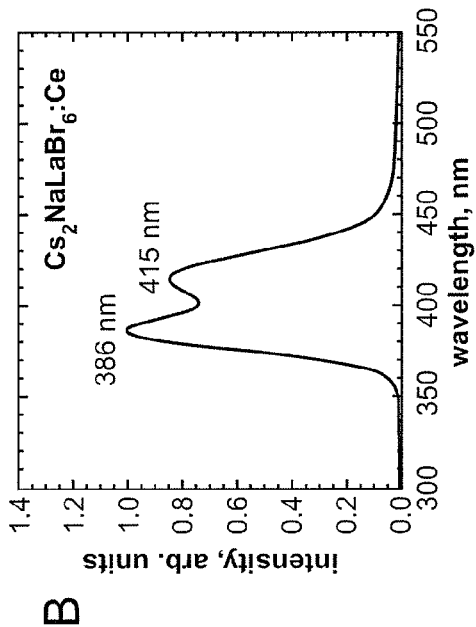
FIGS. 2A through 2D depict optical emission spectra for $Cs_2NaGdI_6$:Ce (FIG. 2A), $Cs_2NaLaBr_6$:Ce (FIG. 2B), $Cs_2NaLaI_6$:Ce (FIG. 2C), and $Cs_2NaLuI_6$:Ce (FIG. 2D) scintillator compositions upon exposure to X-rays.
Figure 2:
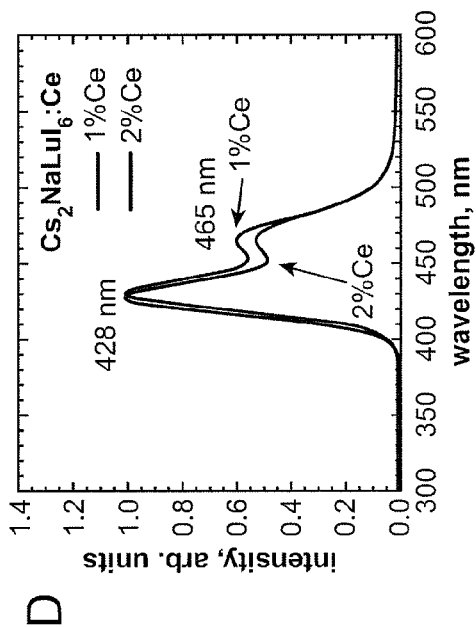
Figure 2:
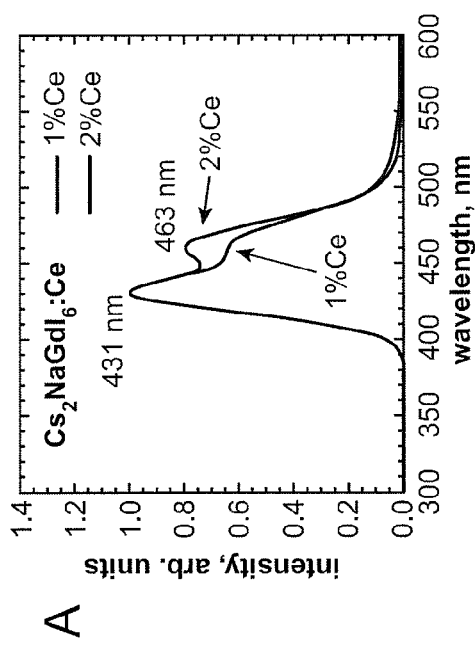
Figure 2:
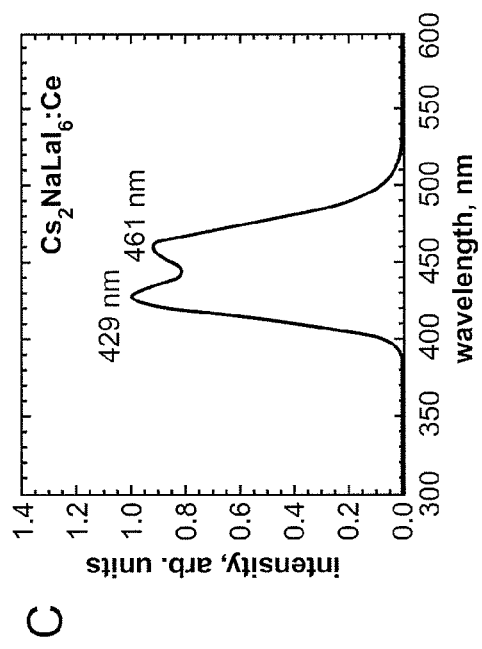

This invention will be better understood with resort to the following definitions:

A. Rise time, in reference to a scintillation crystal material, shall mean the speed with which its light output grows once a gamma-ray has been stopped in the crystal. The contribution of this characteristic of a scintillator combined with the decay time contribute to a timing resolution.

B. A Fast timing scintillator (or fast scintillator) typically includes a timing resolution of about 500 ps or less. For certain PET applications (e.g., time-of-flight (TOF)), the fast scintillator should be capable of localizing an annihilation event as originating from within about a 30 cm distance, i.e., from within a human being scanned.

C. Timing accuracy or resolution, usually defined by the full width half maximum (FWHM) of the time of arrival differences from a point source of annihilation gamma-rays. Because of a number of factors, there is a spread of measured values of times of arrival, even when they are all equal. Usually they distribute along a bell-shaped or Gaussian curve. The FWHM is the width of the curve at a height that is half of the value of the curve at its peak.

D. Light Output shall mean the number of light photons produced per unit energy deposited by the detected gamma-ray, typically the number of light photons/MeV.

E. Stopping power or attenuation shall mean the range of the incoming X-ray or gamma-ray in the scintillation crystal material. The attenuation length, in this case, is the length of crystal material needed to reduce the incoming beam flux to $1/e^-$.

F. Proportionality of response (or linearity). For some applications (such as CT scanning) it is desirable that the light output be substantially proportional to the deposited energy. For applications such as spectroscopy, non-proportionality of response is an important parameter. In a typical scintillator, the number of light photons produced per MeV of incoming gamma-ray energy is not constant. Rather, it varies with the energy of the stopped gamma-ray. This has two deleterious effects. The first is that the energy scale is not linear, but it is possible to calibrate for the effect. The second is that it degrades energy resolution. To see how this occurs, consider a scintillator that produces 300 photons at 150 keV, 160 photons at 100 keV and 60 photons at 50 keV. From statistics alone, the energy resolution at 150 keV should be the variability in 300 photons, which is 5.8%, or 8.7 keV. If every detected event deposited 150 keV in one step this would be the case. On the other hand, if, as it occurs, an event deposited 100 keV in a first interaction and then another 50 keV in a second interaction, the number of photons produced would not be 300 on the average, but 160+60=220 photons, for a difference of 80 photons or 27%. In multiple detections, the peak would broaden well beyond the theoretical 8.7 keV. The smaller the non-proportionality the smaller this broadening and the closer the actual energy resolution approaches the theoretical limit.

The scintillation compositions of the present invention will respond by emitting light after detecting charged particles, high energy photons, and for some embodiments, neutrons, thereby providing useful scintillation properties. The scintillation compound has the formula, $x_1$-$x_2$-$x_3$-$x_4$, and can include Cs as $x_1$, Na as $x_2$, La, Gd, or Lu as $x_3$, and a halide such as Br or I as $x_4$. Gd has a large neutron cross-section. Scintillator compositions can further include a dopant. In certain embodiments, the scintillation compound elements exist in atomic ratios of 2:1:1:6 with a dopant, such as $Cs_2NaGdI_6$:2% Ce.

Scintillator compositions can include a single type of quaternary compound selected from those described herein or a mixture of different compounds described herein. Compositions can, e.g., include mixed halide compositions with at least two different CsNaLa halide compounds. Thus, as different compounds may have different scintillation or performance characteristics, one advantage of the present invention includes the ability to select or customize a particular mixed composition ratio or formulation, where a particular selection or formulation is at least partially based on intended use of the scintillator composition and/or desired properties or scintillation/performance characteristics. For example, a particular mixed quaternary compound composition (e.g., mixed CsNaLa halide composition) formulation may be selected based on one or more of a variety of factors, such as desired stopping power (e.g., at least partially as a function of atomic number), neutron response, bandgap levels tuning/optimization for Ce emission and light output, pulse shape discrimination, gamma-ray sensitivity, and the like.

In one embodiment, a mixed halide scintillator composition can include, for example, a mixture of two or more of $Cs_2NaLaF_6$, $Cs_2NaLaCl_6$, $Cs_2NaLaBr_6$, and $Cs_2NaLaI_6$. As noted above, combinations are not limited to any specific halide ratio/formulation for mixed halide scintillator compositions.

The scintillator compositions of the invention are particularly useful, for example, for spectroscopy detection of energetic photons (e.g., X-rays, gamma-rays), as well as for neutron emission detection. Notable characteristics for the scintillation compositions of the invention include surprisingly robust light output, high gamma-ray and neutron stopping efficiency (attenuation), fast response, and good non-proportionality. Furthermore, the scintillator compositions can be efficiently and economically produced. Thus, detectors having scintillator compositions described in the present invention are useful in a wide variety of applications, including without limitation nuclear and high energy physics research, medical imaging, diffraction, non-destructive testing, nuclear treaty verification and safeguards, and geological exploration.

The scintillator composition of the present invention can optionally include a "dopant". Dopants can affect certain properties, such as physical properties (e.g., brittleness, etc.) as well as scintillation properties (e.g., luminescence, etc.) of the scintillator composition. The dopant can include, for example, cerium (Ce), praseodymium (Pr), lutetium (Lu), lanthanum (La), europium (Eu), samarium (Sm), strontium (Sr), thallium (Tl), chlorine (Cl), fluorine (F), iodine (I), and mixtures of any of the dopants. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.1% to about 20%, by molar weight. In certain embodiments, the amount of dopant is in the range of about 0.1% to about 100%, or about 0.1% to about 5.0%, or about 5.0% to about 20%, by molar weight.

The scintillator compositions of the invention may be prepared in several different forms. In some embodiments, the composition is in a crystalline form (e.g., monocrystalline). Scintillation crystals, such as monocrystalline scintillators, have a greater tendency for transparency than other forms. Scintillators in crystalline form (e.g., scintillation crystals) are often useful for high-energy radiation detectors, e.g., those used for gamma-ray or X-ray detection. However, the composition can include other forms as well, and the selected form may depend, in part, on the intended end use of the scintillator. For example, a scintillator can be in a powder form. It can also be prepared in the form of a ceramic or polycrystalline ceramic. Other forms of scintillation compositions will be recognized and can include, for example, glasses, deposits, vapor deposited films, microcolumnar, or other forms suitable for radiation detection as described herein. It should also be understood that a scintillator composition might contain small amounts of impurities. Also, minor amounts of other materials may be purposefully included in the scintillator compositions to affect the properties of the scintillator compositions.

Methods for making crystal materials can include those methods described herein and may further include other techniques. Typically, the appropriate reactants are melted at a temperature sufficient to form a congruent, molten composition. The melting temperature will depend on the identity of the reactants themselves (see, e.g., melting points of reactants), but is usually in the range of about 300° C. to about 1350° C. Non-limiting examples of the crystal-growing methods can include certain techniques of the Bridgman-Stockbarger methods; the Czochralski methods, the zone-melting methods (or "floating zone" method), the vertical gradient freeze (VGF) methods, and the temperature gradient methods. See, e.g., Example 1 infra. (see also, e.g., "Luminescent Materials", by G. Blasse et al, Springer-Verlag (1994) and "Crystal Growth Processes", by J. C. Brice, Blackie & Son Ltd (1986)).

In the practice of the present invention, attention is paid to the physical properties of the scintillator material. In particular applications, properties such as hygroscopy (tendency to absorb water), brittleness (tendency to crack), and crumbliness should be minimal.

TABLE I

Properties of Scintillators

| Material | Light Output (Photons/MeV) | Density (g/cm³) | Wavelength Of Emission (nm) | Rise-time (ns) | Principal Decay Time (ns) |
|---|---|---|---|---|---|
| NaI(Tl) | 38,000 | 3.67 | 415 | >10 | 230 |
| CsI(Tl) | 52,000 | 4.51 | 540 | >10 | 1000 |
| LSO | 24,000 | 7.4 | 420 | <1 | 40 |
| BGO | 8,200 | 7.13 | 505 | >1 | 300 |
| BaF$_2$ | 10,000 ~2,000 fast | 4.88 | 310, slow 220, fast | <0.1 | 620, slow 0.6, fast |
| GSO | 7,600 | 6.7 | 430 | ~8 | 60 |
| CdWO$_4$ | 15,000 | 8.0 | 480 | | 5000 |
| YAP | 20,000 | 5.55 | 370 | <1 | 26 |
| Cs$_2$NaLaBr$_6$:Ce | 12,000 | 3.91 | 386 | 30 | 55 |
| Cs$_2$NaGdI$_6$:Ce | 26,000 | ~4 | 431 | 0.85 | 55 |
| Cs$_2$NaLaI$_6$:Ce | 49,000 | ~4 | 429 | 4 | 50 |
| Cs$_2$NaLuI$_6$:Ce | 27,000 | 4.6 | 428 | 0.85 | 35 |

Table I provides a listing of certain properties of a number of scintillators. Compared to other commercially available scintillators, including CsI, which is among the scintillation materials with the highest known light output, the scintillator compositions of these inventions produce comparable light output. In addition, they have a fast principal decay-time constant.

As set forth above, scintillator compositions of the present invention may find use in a wide variety of applications. In one embodiment, for example, the invention is directed to a method for detecting energy radiation (e.g., gamma-rays, X-rays, neutron emissions, and the like) with a scintillation detector including the scintillation composition of the invention.

Figure 5:
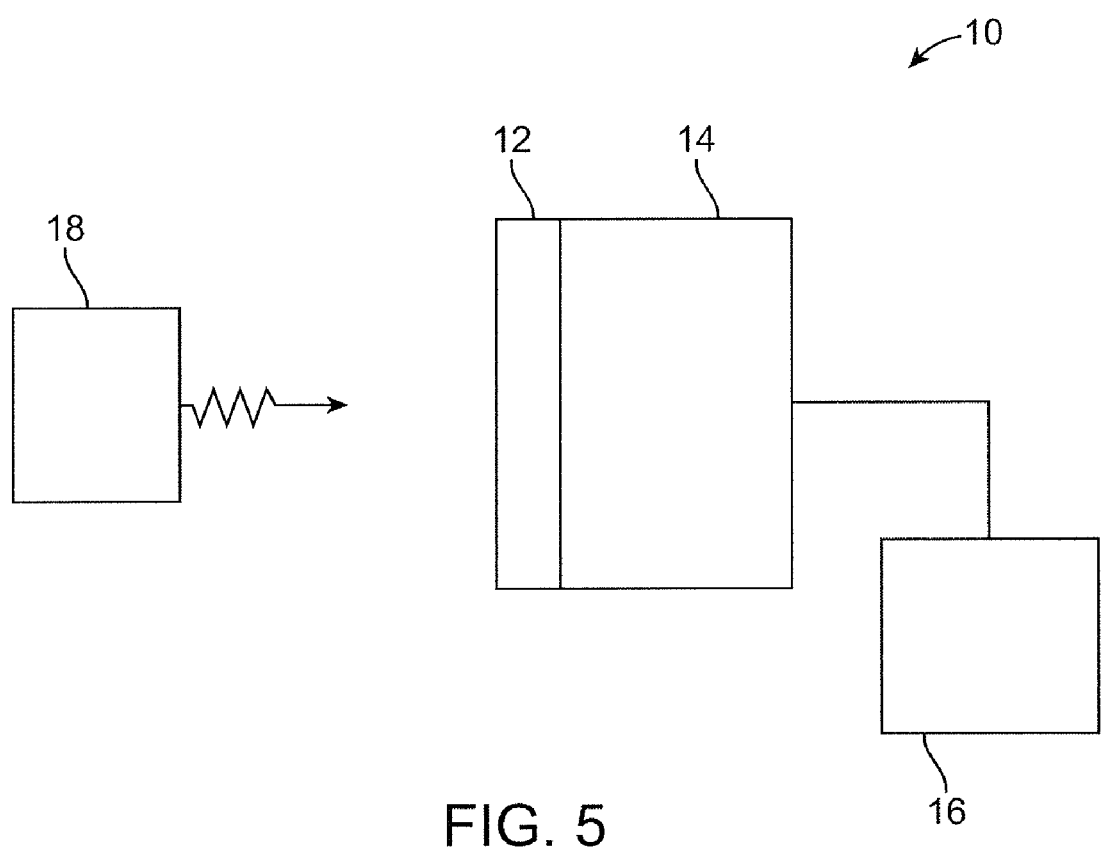
FIG. 5 is a conceptual diagram of a detector assembly of the present invention.

FIG. 5 is a diagram of a detector assembly of the present invention. The detector 10 includes a scintillator 12 optically coupled to a light photodetector 14 or imaging device. The detector assembly 10 can include a data analysis, or computer, system 16 to process information from the scintillator 12 and light photodetector 14. In use, the detector 10 detects energetic radiation emitted form a source 18.

A data analysis, or computer, system thereof can include, for example, a module or system to process information (e.g., radiation detection information) from the detector/photodetectors can also be included in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator composition described herein (e.g., one or more scintillator crystals). The detector further can include, for example, a light detection assembly including one or more photodetectors. Non-limiting examples of photodetectors include photomultiplier tubes (PMT), photodiodes, CCD sensors, image intensifiers, and the like. Choice of a particular photodetector will depend in part on the type of radiation detector being fabricated and on its intended use of the device. In certain embodiments, the photodetector may be position-sensitive.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Various technologies for operably coupling or integrating a radiation detector assembly containing a scintillator to a detection device can be utilized in the present invention, including various known techniques.

The detectors may also be connected to a visualization interface, imaging equipment, or digital imaging equipment (e.g., pixilated flat panel devices). In some embodiments, the scintillator may serve as a component of a screen scintillator. For example, powdered scintillator material could be formed into a relatively flat plate, which is attached to a film, such as photographic film. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like.

Imaging devices, including medical imaging equipment, such as the PET and SPECT devices, and the like, represent another important application for invention scintillator compositions and radiation detectors. Furthermore, geological exploration devices, such as well-logging devices, were mentioned previously and represent an important application for these radiation detectors. The assembly containing the scintillator usually includes, for example, an optical window at one end of the enclosure-casing. The window permits radiation-induced scintillation light to pass out of the scintillator assembly for measurement by the photon detection assembly or light-sensing device (e.g., photomultiplier tube, etc.), which is coupled to the scintillator assembly. The light-sensing device converts the light photons emitted from the scintillator into electrical pulses that may be shaped and digitized, for example, by the associated electronics. By this general process, gamma-rays can be detected, which in turn provides an analysis of geological formations, such as rock strata surrounding the drilling bore holes.

In many of the applications of a scintillator composition as set forth above (e.g., nuclear weapons monitoring and detection, imaging, and well-logging and PET technologies), certain characteristics of the scintillator are desirable, including high light output, fast rise time and short decay time, good timing resolution, and suitable physical properties. The present invention is expected to provide scintillator materials that can provide the desired high light output and initial photon intensity characteristics for demanding applications of the technologies. Moreover, the invention scintillator compositions are also expected to simultaneously exhibit the other important properties noted above, e.g., short decay time and good stopping power. Furthermore, the scintillator materials are also expected to be produced efficiently and economically, and also expected to be employed in a variety of other devices which require radiation/signal detection (e.g., gamma-ray, X-ray, neutron emissions, and the like).

The following examples are intended to illustrate but not limit the invention.

EXAMPLES

Example 1

The present example provides a method for growing and provides characterization for the scintillator composition crystals. The following examples are offered by way of illustration, not by way of limitation.

Crystal Growth of Compounds Exemplified with $Cs_2NaLaBr_6$, $Cs_2NaGdI_6$, $Cs_2NaLaI_6$ and $Cs_2NaLuI_6$ In one example, a one zone Bridgman furnace was used for crystal growth. Typical growth rates for the Bridgman process are about 1-6 mm/hour. Growth rates ranging from about 1 mm/day to about 1 cm/hour may be utilized. The range of rates may be extended to improve material quality.

$Cs_2NaLaBr_6$, $Cs_2NaGdI_6$, $Cs_2NaLaI_6$, and $Cs_2NaLuI_6$ have a cubic crystal structure. The densities of $Cs_2NaLaBr_6$, $Cs_2NaGdI_6$, $Cs_2NaLaI_6$, and $Cs_2NaLuI_6$ are between about 3.9 and about 4.6 g/cm$^3$. The compositions melt congruently at approximately 78, 925, 778, and 1050° C., respectively, and therefore their crystals can be grown using melt based methods such as those described by Bridgman and Czochralski. These melt-based processes are well suited for growth of large volume crystals (Brice, *Crystal Growth Processes*, Blackie Halsted Press (1986)). The Bridgman method has been used for growing $Cs_2NaLaBr_6$, $Cs_2NaGdI_6$, $Cs_2NaLaI_6$, and $Cs_2NaLuI_6$. Both the vertical and horizontal orientations of the Bridgman method can be used in producing crystals of the present invention. In certain embodiments, the vertical Bridgman method was used in producing crystals examined and discussed below.

$Cs_2NaLaBr_6$: Single crystals of this material were grown by the Bridgman technique in vertical silica ampoules under vacuum. Starting materials were CsBr (Aldrich, anhydrous, 99.9%), NaBr (Aldrich, anhydrous, 99.9%), and $LaBr_3$ (Aldrich, anhydrous, 99.99+%).

$Cs_2NaGdI_6$: Single crystals of this material were grown by the Bridgman technique in vertical silica ampoules under vacuum. Starting materials were CsI (Aldrich, anhydrous, 99.9%), NaI (Aldrich, anhydrous, 99.9%), and $GdI_3$ (Aldrich, anhydrous, 99.99+%).

$Cs_2NaLaI_6$: Single crystals of this material were grown by the Bridgman technique in vertical silica ampoules under vacuum. Starting materials were CsI (Aldrich, anhydrous, 99.9%), NaI (Aldrich, anhydrous, 99.9%), and $LaI_3$ (Aldrich, anhydrous, 99.99+%).

$Cs_2NaLuI_6$: Single crystals of this material were grown by the Bridgman technique in vertical silica ampoules under vacuum. Starting materials were CsI (Aldrich, anhydrous, 99.9%), NaI (Aldrich, anhydrous, 99.9%), and $LuI_3$ (Aldrich, anhydrous, 99.99+%).

Scintillation Properties of Scintillator Compositions

Scintillation properties of small Bridgman grown scintillation composition crystals ($\leq 300$ mm$^3$) have been characterized. This investigation involved measurement of the light output, the emission spectrum, and the scintillation decay time of the crystals. Energy resolution of sample crystals and their proportionality of response were also measured.

1. Light Output and Energy Resolution

As shown in FIGS. 1A, B, C, and D, the energy resolution of the 662 keV photopeak recorded with the scintillator compositions has been measured to be in the vicinity of 7.6%, 11%, 5.25%, and 8.5% (FWHM) at room temperature for $Cs_2NaGdI_6$:2% Ce, $Cs_2NaLaBr_6$:0.2% Ce, $Cs_2NaLaI_6$:5% Ce, and $Cs_2NaLuI_6$:1 % Ce, respectively. The light output of scintillator composition crystals was measured by comparing their response to 662 keV γ-rays ($^{137}$Cs source) to the response of a BGO scintillator to the same isotope (see FIGS. 1A, C, and D). This measurement involved optical coupling of a scintillator crystal to a photomultiplier tube (with multi-alkali S-20 photocathode), irradiating the scintillator with 662 keV photons, and recording the resulting pulse height spectrum. In order to maximize light collection, the scintillator composition crystal was wrapped in reflective white Teflon tape on all faces (except the one coupled to the PMT). An index matching silicone fluid was also used at the PMT-scintillator interface. A pulse height spectrum was recorded with a scintillator composition crystal. This experiment was then repeated with a BGO scintillator. Comparison of the photopeak position obtained with the scintillator composition for 662 keV photon energy to that with BGO provided estimation of light output for the scintillator composition crystal. FIGS. 1A, B, C, and D show the pulse height spectra for a scintillator composition under $^{137}$Cs irradiation and amplifier shaping time of 4.0 μs. This shaping time is long enough to allow full light collection from both the scintillators. The PMT bias and amplifier gain were the same for both spectra. Based on the recorded photopeak positions for each scintillator composition and BGO, light output of $Cs_2NaGdI_6$:2% Ce, $Cs_2NaLaBr_6$:0.2% Ce, $Cs_2NaLaI_6$:5% Ce, and $Cs_2NaLuI_6$:1% Ce crystals was estimated to be about 26,500 photons/MeV, 12,000 photons/MeV, 48,500 photons/MeV, and 27,000 photons/MeV, respectively.

2. Emission Spectrum

Normalized emission spectra for the scintillator compositions are shown in FIGS. 2A through 2D. The scintillator composition samples were excited with radiation from a Philips X-ray tube having a Cu target, with power settings of 40 kVp and 20 mA. The scintillation light was passed through a McPherson monochromator and detected by a photomultiplier tube. The peak emission wavelength for the $Cs_2NaGdI_6$:Ce, $Cs_2NaLaBr_6$:Ce, $Cs_2NaLaI_6$:Ce, and $Cs_2NaLuI_6$:Ce samples was at approximately 431 nm, 386 nm, 429 nm, and 428 nm, respectively. Peak emission wavelengths in this range are attractive for gamma-ray spectroscopy because they match well with the spectral response of the photomultiplier tubes as well as a new generation of silicon photodiodes.

3. Time Profiles

Figure 3:
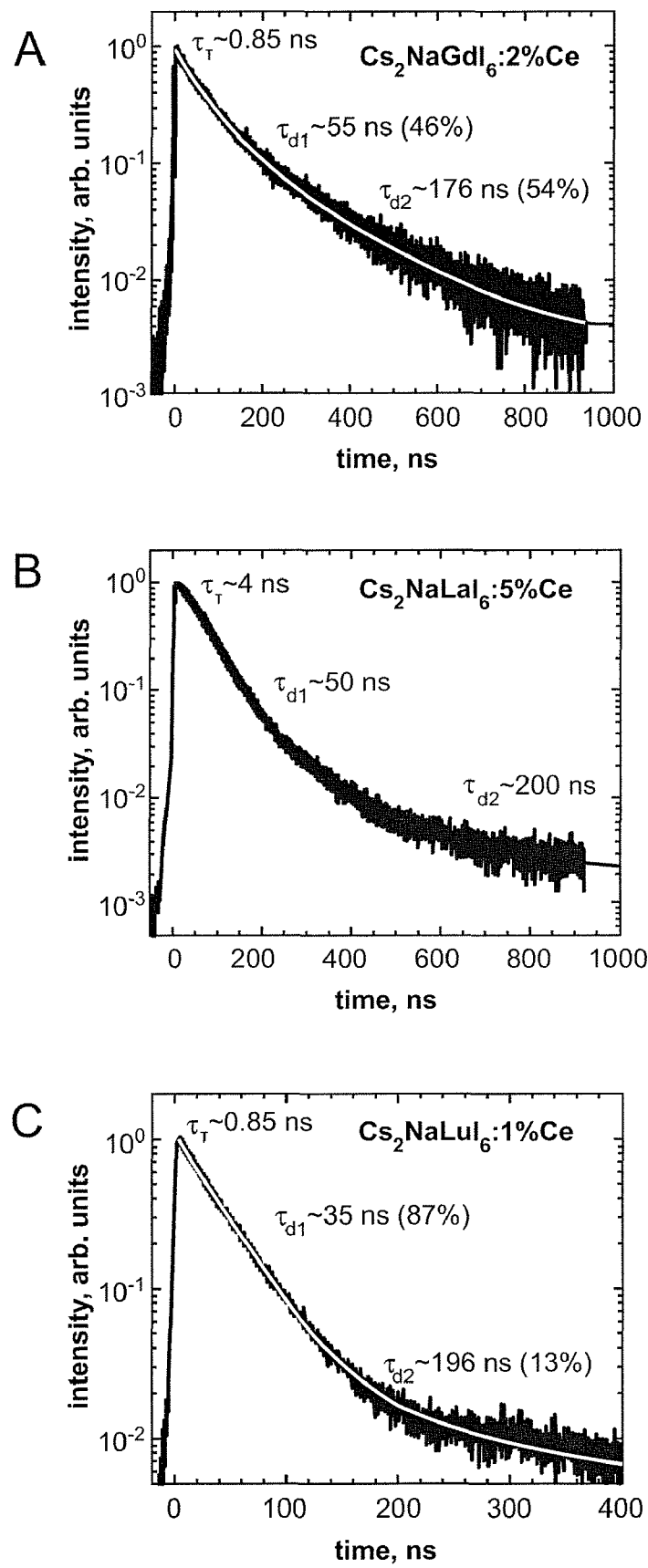
FIGS. 3A through 3C depict time profiles for $Cs_2NaGdI_6$:2% Ce (FIG. 3A), $Cs_2NaLaI_6$:5% Ce (FIG. 2B), and $Cs_2NaLuI_6$:1% Ce (FIG. 2C) exposed to gamma rays. Risetimes ($\tau_r$) for $Cs_2NaGdI_6$:2% Ce, $Cs_2NaLaI_6$:5% Ce, and $Cs_2NaLuI_6$:1% Ce were 0.85 ns, 4 ns, and 0.85 ns, respectively, in certain embodiments. Principal decay times ($\tau_{d1}$) for $Cs_2NaGdI_6$:2% Ce, $Cs_2NaLaI_6$:5% Ce, and $Cs_2NaLuI_6$:1% Ce were 55 ns, 50 ns, and 35 ns, respectively.

FIGS. 3 A, B, and C show the time profiles recorded for $Cs_2NaGdI_6$:2% Ce, $Cs_2NaLaI_6$:5% Ce, and $Cs_2NaLuI_6$:1% Ce samples, respectively. Time profiles of the scintillator compositions have been measured under gamma ray excitation using the delayed coincidence method (Bollinger and Thomas, *Rev. Sci. Instr.* 32:1044 (1961)). For $Cs_2NaGdI_6$:2% Ce, the rise time of the scintillation pulse is ~0.85 ns and the principal decay time is about 55 ns. For $Cs_2NaLaI_6$:5% Ce, the rise time of the scintillation pulse is ~4 ns and the principal decay time is about 50 ns. For $Cs_2NaLuI_6$:1% Ce, the rise time of the scintillation pulse is ~0.85 ns and the principal decay time is about 35 ns. FIGS. 3A-C also show secondary, slower decay components present in time profiles.

4. Non-Proportionality

Figure 4:
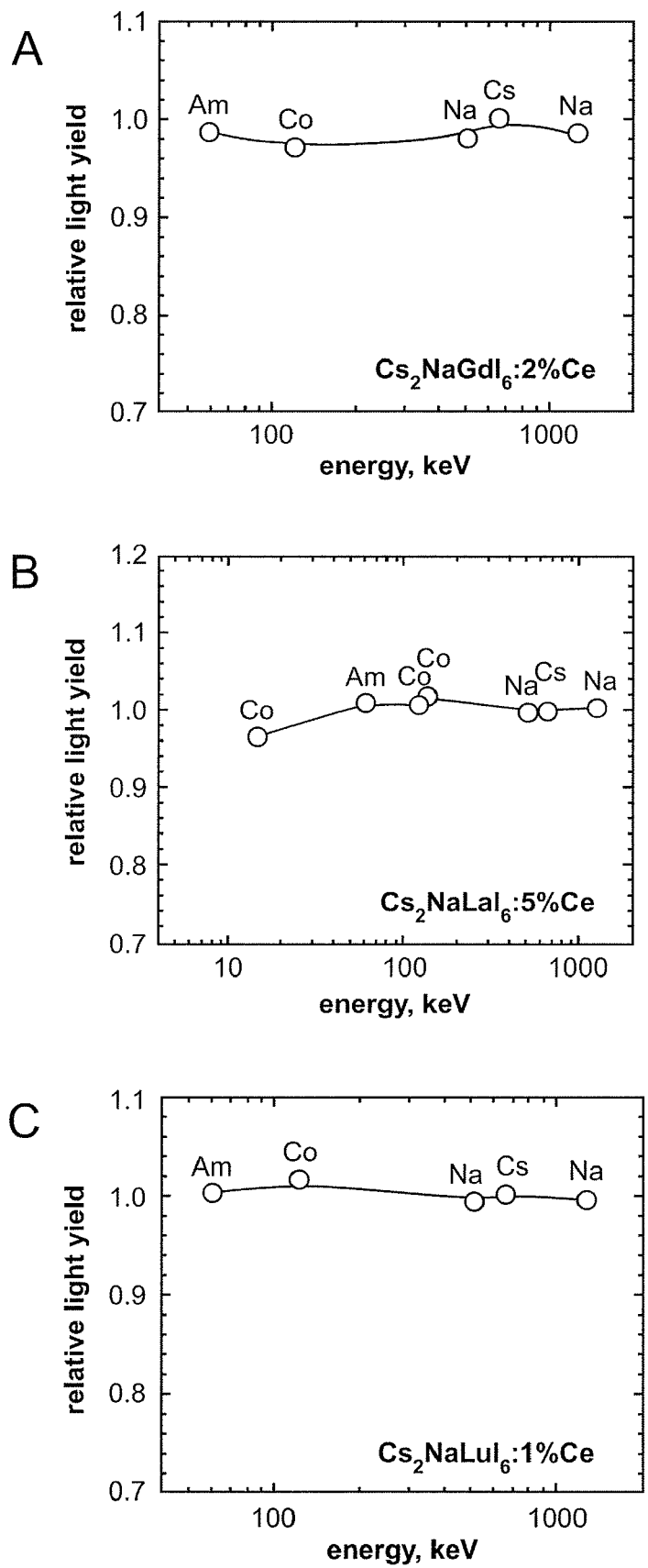
FIGS. 4A through 4C illustrate non-proportionality for $Cs_2NaGdI_6$:2% Ce (FIG. 4A), $Cs_2NaLaI_6$:5% Ce (FIG. 4B), and $Cs_2NaLuI_6$:1% Ce (FIG. 4C) scintillator compositions. The figure shows light output of the scintillator compositions measured under excitation from isotopes such as $^{241}$Am (60 keV γ-rays), $^{57}$Co (122 keV γ-rays), $^{22}$Na (511 keV and 1275 keV γ-rays), and $^{137}$Cs (662 keV γ-rays).

As shown in FIGS. 4 A, B, and C, the non-proportionality of $Cs_2NaGdI_6$:2% Ce, $Cs_2NaLaI_6$:5% Ce, and $Cs_2NaLuI_6$:1% Ce scintillator compositions was evaluated, respectively. Non-proportionality (as a function of energy) in light yield can be one of the important reasons for degradation in energy resolution of established scintillators such as NaI(Tl) and CsI(Tl) (Dorenbos et al., *IEEE Trans. Nuc. Sci.* 42:2190 (1995)). Light output of the scintillator compositions was measured under excitation from isotopes such as $^{241}$Am (60 keV γ-rays), $^{57}$Co (122 keV, 136 keV, and 14.4 keV γ-rays), $^{22}$Na (511 keV and 1275 keV γ-rays) and $^{137}$Cs (662 keV γ-rays). The test crystals were wrapped in Teflon tape and coupled to a PMT. Pulse height measurements were performed using standard NIM equipment with the scintillator exposed to different radioisotopes. The same settings were used for the PMT and pulse processing electronics for each isotope. From the measured peak position and the known γ-ray energy for each isotope, the light output (in photons/MeV) at each γ-ray energy was estimated. The data points were then normalized with respect to the light output value at 662 keV energy and the results (shown in FIGS. 4 A, B, and C) indicated that $Cs_2NaGdI_6$:2% Ce, $Cs_2NaLaI_6$:5% Ce, and $Cs_2NaLuI_6$:1% Ce were very proportional scintillators. Over in the energy range from about 60 to about 1275 keV, the non-proportionality in light yield was less than about 5%, typically between about 2 to 3% (for corresponding values for other established scintillators see, e.g., Guillot-Noel et al., *IEEE Trans. Nuc. Sci* 46: 1274-1284 (1999)).

Overall, these measurements indicated that the scintillator compositions as described in the present invention have high light output, fast response and show good qualities in terms of light output, energy resolution, speed and exceptional non-proportionality.

Although the invention has been described with reference to the above examples, it will be understood that modifications and variations are encompassed within the spirit and scope of the invention. Accordingly, the invention is limited only by the following claims along with their full scope of equivalents. All publications and patent documents cited in this application are incorporated by reference in their entirety for all purposes to the same extent as if each individual publication or patent document were so individually denoted.

What is claimed is:

1. A mixed halide scintillator composition, comprising at least two different CsNaLa halide compounds and a dopant.

2. The scintillator of claim 1, wherein the different CsNaLa halide compounds are selected from $Cs_2NaLaF_6$, $Cs_2NaLaBr_6$, $Cs_2NaLaCl_6$, and $Cs_2NaLaI_6$.

3. The scintillator of claim 1, wherein the dopant comprises Ce.

4. The scintillator of claim 1, wherein the dopant is present at less than about 20% by molar weight.

5. The scintillator of claim 1, wherein the dopant comprises Ce present at equal to or less than about 5% by molar weight.

6. The scintillator of claim 1, wherein the scintillator comprises a crystalline, ceramic, or polycrystalline ceramic form.

7. A radiation detection device, a mixed halide scintillator composition, comprising at least two different CsNaLa halide compounds and a dopant; and a photodetector assembly optically coupled to the scintillator.

8. The device of claim 7, wherein the photodetector assembly comprises a photomultiplier tube, a photodiode, a PIN detector, charge-coupled device, or an avalanche detector.

9. The device of claim 7, further comprising a radiation source.

10. The device of claim 7, further comprising a computer system coupled to the photodetector assembly so that the computer outputs image data in response to detected radiation.

11. The device of claim 10, wherein the computer comprises instructions for constructing an image from detected radiation.

12. The device of claim 7, wherein the device is configured to detect x-rays, gamma-rays, or a combination thereof.

13. A method of performing radiation detection, comprising:

providing a detection device comprising a mixed halide scintillator composition, comprising at least two different CsNaLa halide compounds and a dopant; and a photodetector assembly optically coupled to the scintillator; and positioning the device such that a radiation source is within a field of view of the scintillator composition so as to detect emissions from the source.

14. The method of claim 13, wherein the emissions comprise gamma-ray or X-ray emissions.

15. The method of claim 13, wherein a patient is positioned between the radiation source and the scintillator composition.

16. The method of claim 13, wherein the radiation source comprises a patient.

* * * * *